United States Patent
Su et al.

(10) Patent No.: US 10,784,150 B2
(45) Date of Patent: *Sep. 22, 2020

(54) SEMICONDUCTOR STRUCTURE AND MANUFACTURING METHOD THEREOF

(71) Applicant: Taiwan Semiconductor Manufacturing Company Ltd., Hsinchu (CN)

(72) Inventors: Ching-Chung Su, Tainan (TW); Jiech-Fun Lu, Tainan County (TW); Jian Wu, Shanghai (CN); Che-Hsiang Hsueh, Tainan (TW); Ming-Chi Wu, Kaohsiung (TW); Chi-Yuan Wen, Tainan (TW); Chun-Chieh Fang, Hsinchu (TW); Yu-Lung Yeh, Kaohsiung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/394,772

(22) Filed: Apr. 25, 2019

(65) Prior Publication Data

US 2019/0252241 A1    Aug. 15, 2019

Related U.S. Application Data

(60) Continuation of application No. 15/990,162, filed on May 25, 2018, now Pat. No. 10,276,427, which is a
(Continued)

(51) Int. Cl.
*H01L 21/764* (2006.01)
*H01L 21/762* (2006.01)
*H01L 21/308* (2006.01)

(52) U.S. Cl.
CPC ........ *H01L 21/764* (2013.01); *H01L 21/3083* (2013.01); *H01L 21/76232* (2013.01)

(58) Field of Classification Search
CPC .............. H01L 21/764; H01L 21/3083; H01L 21/76232
See application file for complete search history.

(56) References Cited

U.S. PATENT DOCUMENTS 6,207,532 B1   3/2001 Lin et al.
7,038,289 B2   5/2006 Marty et al.
(Continued)

FOREIGN PATENT DOCUMENTS

CN    101950730 A    1/2011
DE    10214118961    7/2015

*Primary Examiner* — Marc Anthony Armand
(74) *Attorney, Agent, or Firm* — Haynes and Boone, LLP

(57) ABSTRACT

A semiconductor structure includes a semiconductive substrate including a first surface and a second surface opposite to the first surface, a shallow trench isolation (STI) including a first portion at least partially disposed within the semiconductive substrate and tapered from the first surface towards the second surface, and a second portion disposed inside the semiconductive substrate, coupled with the first portion and extended from the first portion towards the second surface, and a void enclosed by the STI, wherein the void is at least partially disposed within the second portion of the STI.

20 Claims, 14 Drawing Sheets

Related U.S. Application Data division of application No. 15/088,126, filed on Apr. 1, 2016, now Pat. No. 9,984,918.

(60) Provisional application No. 62/273,808, filed on Dec. 31, 2015.

(56) References Cited

U.S. PATENT DOCUMENTS

| | | |
|---|---|---|
| 8,461,015 B2 | 6/2013 | Huang et al. |
| 8,598,675 B2 | 12/2013 | Wang et al. |
| 9,590,090 B2 | 3/2017 | Fu et al. |
| 2004/0147093 A1* | 7/2004 | Marty ............... H01L 21/76232 438/442 |
| 2007/0018215 A1 | 1/2007 | Sandhu et al. |
| 2007/0212848 A1 | 9/2007 | Sandhu et al. |
| 2007/0235783 A9 | 10/2007 | Sandhu et al. |
| 2008/0102579 A1 | 5/2008 | Dong et al. |
| 2011/0008970 A1 | 1/2011 | Alapati et al. |
| 2012/0205774 A1* | 8/2012 | Wang ................ H01L 21/76232 257/506 |
| 2015/0371889 A1 | 12/2015 | Kim et al. |

* cited by examiner

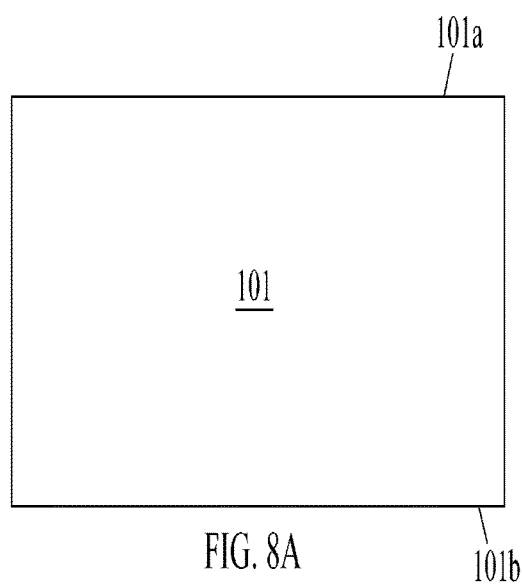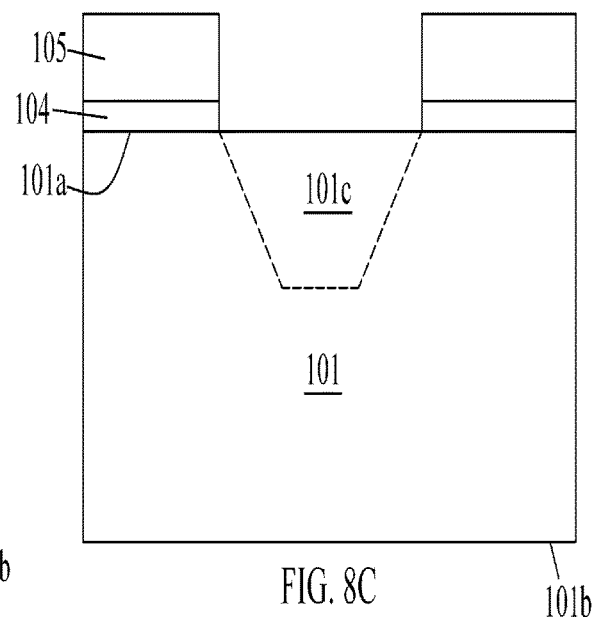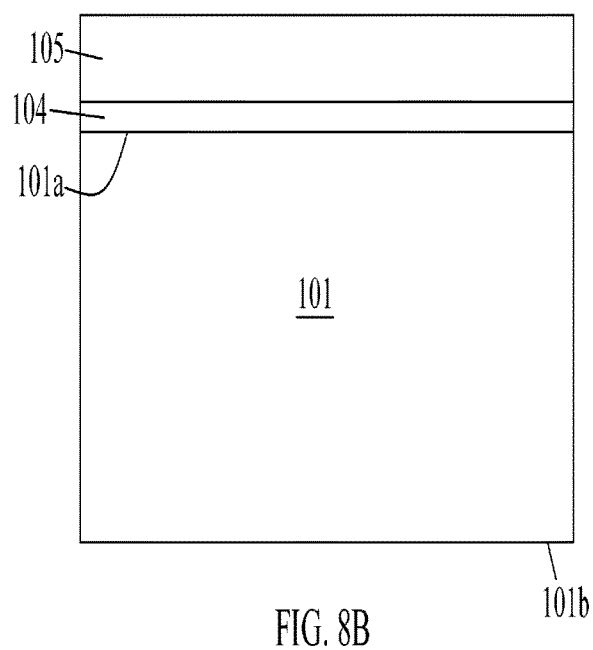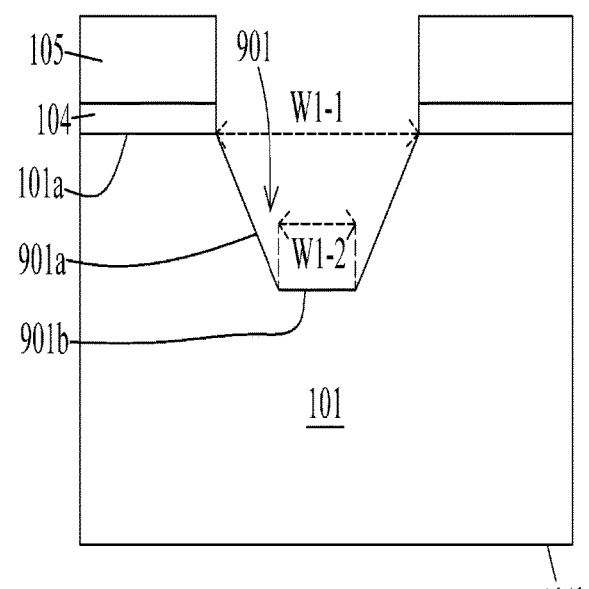

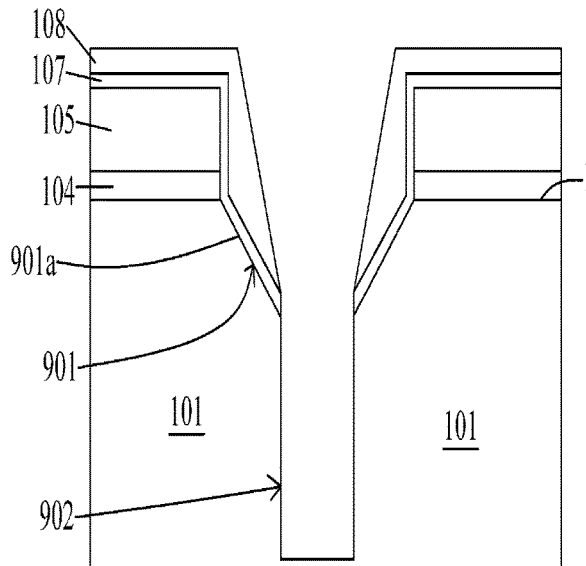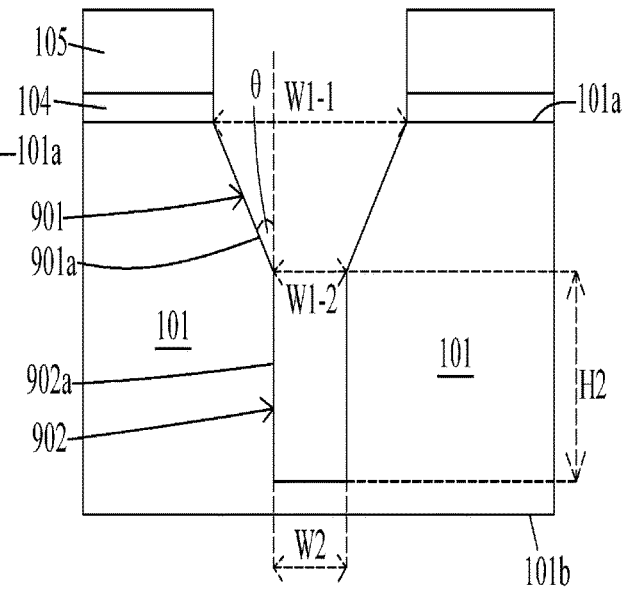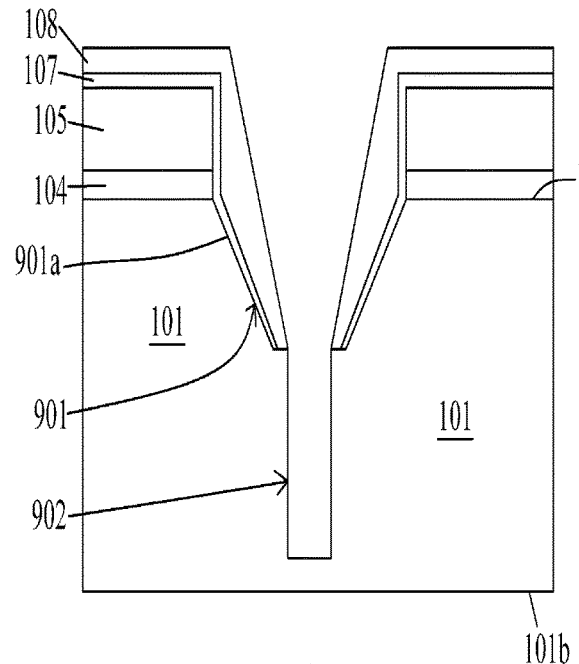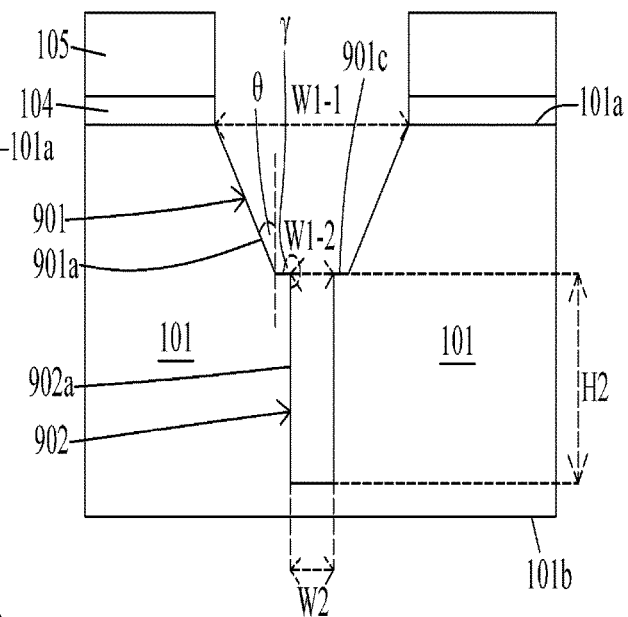

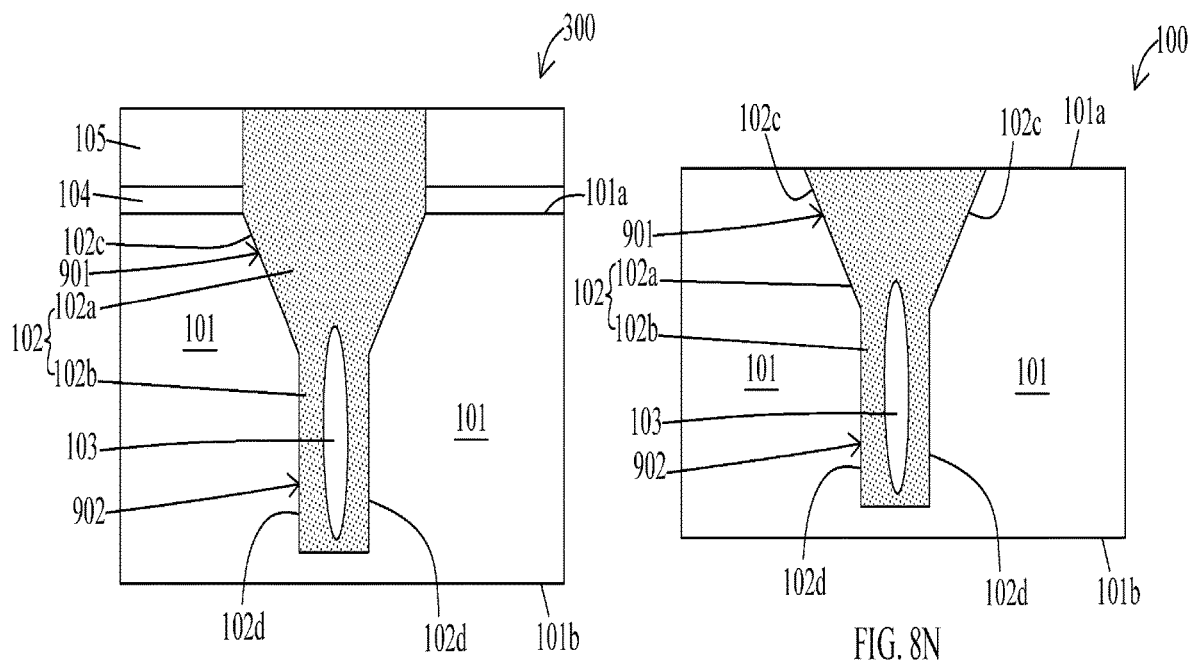
FIG. 8L
FIG. 8N
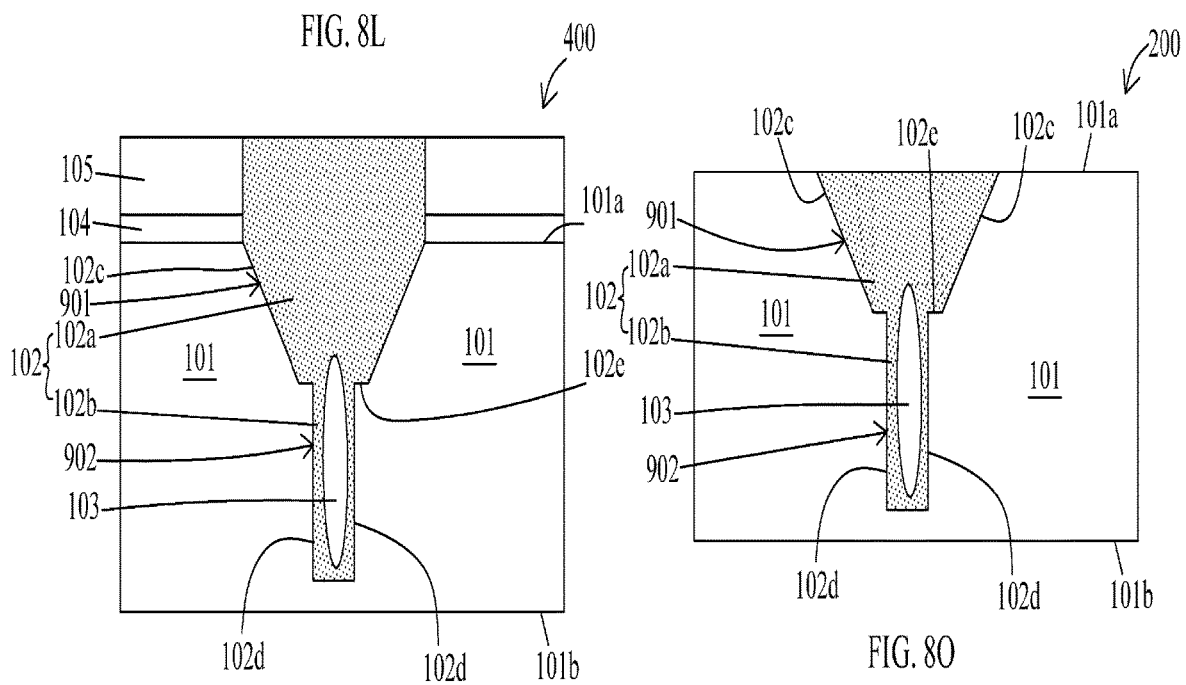
FIG. 8M
FIG. 8O

SEMICONDUCTOR STRUCTURE AND MANUFACTURING METHOD THEREOF

PRIORITY CLAIM AND CROSS-REFERENCE

This application is a Continuation Application of U.S. application Ser. No. 15/990,162, filed May 25, 2018, which is a Divisional Application of U.S. application Ser. No. 15/088,126 filed Apr. 1, 2016, now U.S. Pat. No. 9,984,918, which also claims the benefit of U.S. provisional application Ser. No. 62/273,808 filed on Dec. 31, 2015, entitled "Semiconductor Structure and Manufacturing Method Thereof", the disclosure of which is disclosure of which are hereby incorporated by reference in its their entirety.

BACKGROUND

Electronic equipments using semiconductor devices are essential for many modern applications. With the advancement of electronic technology, the semiconductor devices are becoming increasingly smaller in size while having greater functionality and greater amounts of integrated circuitry. Fabrication of semiconductor devices typically involves placing numerous components over a semiconductor substrate. Isolation structures are used to electrically isolate the components from each other. The components are then interconnected by forming conductive lines over the isolation structures.

Due to the miniaturized scale of the semiconductor device, the components density over the semiconductor substrate continues to increase, while a distance between the components continues to decrease. Numerous manufacturing operations are implemented within such a small semiconductor device, and the formation of the isolation structures becomes challenging. An increase in a complexity of manufacturing the semiconductor device may cause deficiencies such as poor electrical isolation, development of cracks or high yield loss of the semiconductor device. Since more different components with different materials are involved, there are many challenges for modifying a structure of the semiconductor devices and improving the manufacturing operations.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION OF THE DISCLOSURE

Figure 1:
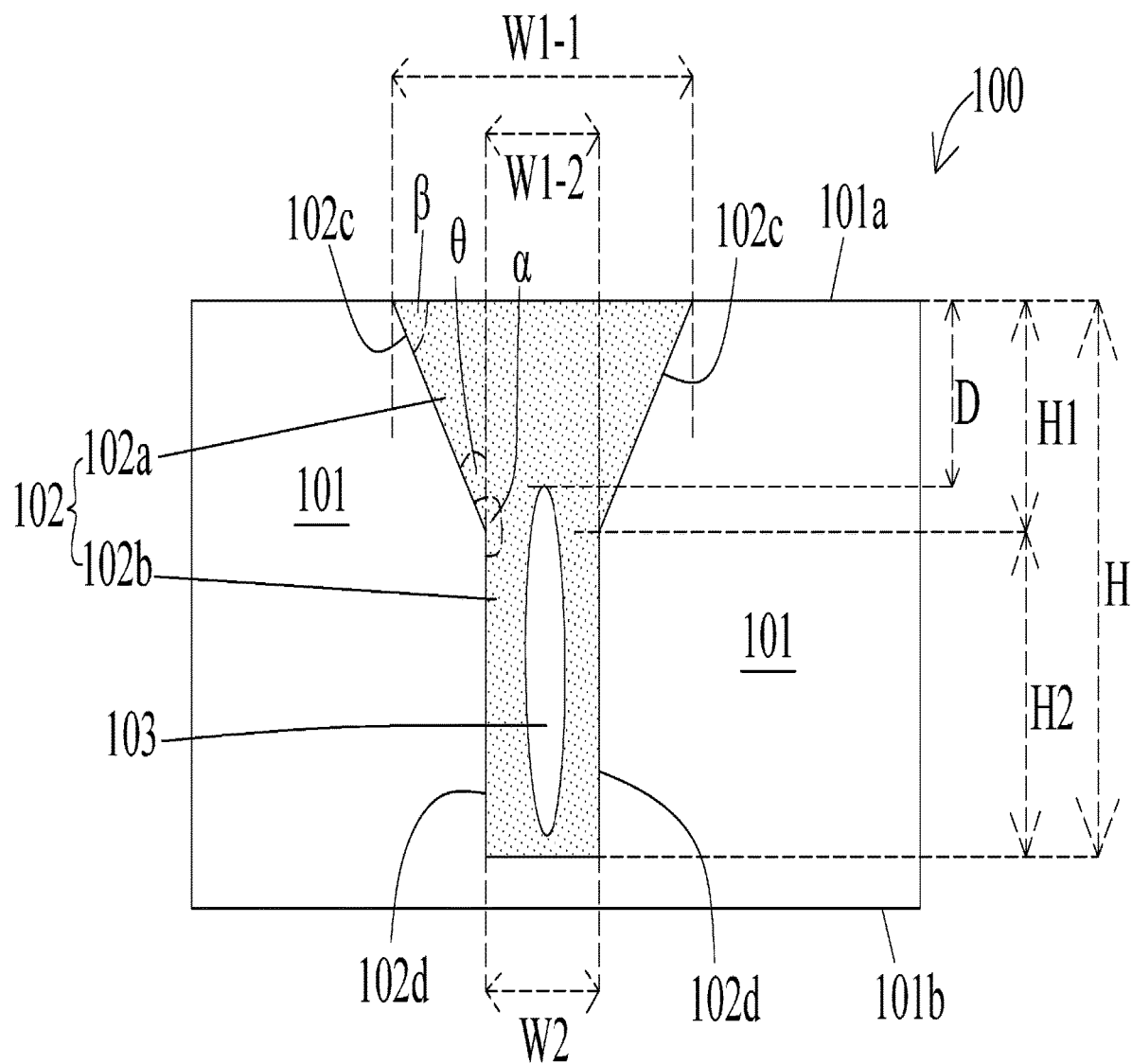
FIG. 1 is a schematic cross sectional view of a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trench isolation is employed in a semiconductor structure to electrically isolate semiconductor components from each other. The trench isolation is formed by removing a portion of a semiconductive substrate to form a trench over the semiconductive substrate and then filling the trench with a dielectric material. As the components are close to each other, an undesirable parasitic capacitance would be induced between components. The parasitic capacitance can be minimized by forming an air gap having a low dielectric constant (low k) within the trench isolation, such that an optical crosstalk between components or current leakage would be reduced and sensitivity of the semiconductor structure would be improved.

Further, due to a difference between coefficients of the thermal expansion (CTE) of the semiconductive substrate and the trench isolation, a thermal or mechanical stress would be developed after thermal operations. The air gap can serve as a buffer and reduce stress developed in the semiconductor structure. It is desirable to form the air gap at a position distal to a surface of the semiconductive substrate or at a bottom portion of the trench isolation in order to avoid polysilicon bridging defect. However, a position of the air gap in the trench isolation is difficult to control.

In the present disclosure, a semiconductor structure is disclosed. The semiconductor structure includes a shallow trench isolation (STI) at least partially disposed within a semiconductive substrate and a void enclosed by the STI. The STI includes a first portion tapered into the semiconductive substrate and a second portion coupled with and extended from the first portion into the semiconductive substrate. The first portion is tapered and thus includes at least two widths, and the second portion is extended in a consistent width. Further, a gradient of a sidewall of the second portion is substantially different from or greater than a gradient of a sidewall of the first portion. Such structural configuration of the STI allows the void to be formed at least partially within the second portion of the STI or at a position away from the surface of the semiconductive substrate.

FIG. 1 is a schematic cross sectional view of a semiconductor structure 100 in accordance with some embodiments of the present disclosure. In some embodiments, the semiconductor structure 100 includes a semiconductive substrate 101, a shallow trench isolation (STI) 102 and a void 103. In some embodiments, the semiconductor structure 100 is a part of a semiconductor device. In some embodiments, the semiconductor structure 100 is a part of an image sensing device for sensing an electromagnetic radiation entering into the semiconductor structure 100.

In some embodiments, the semiconductive substrate 101 is a silicon substrate or a silicon wafer. In some embodiments, the substrate 101 includes silicon, germanium, gallium arsenide or other suitable semiconductive materials. In some embodiments, the substrate 101 is a single crystalline or polycrystalline silicon substrate. In some embodiments, the substrate 101 includes several conductive structures, electrical components, etc. In some embodiments, the substrate 101 includes a first surface 101a and a second surface 101b opposite to the first surface 101a. In some embodiments, the first surface 101a is at a front side of the substrate 101, and the second surface 101b is at a back side of the substrate 101. In some embodiments, several circuitries or components are subsequently formed over the first surface 101a.

In some embodiments, the STI 102 is surrounded by or at least partially disposed within the substrate 101. In some embodiments, the STI 102 is configured to electrically isolate components disposed within or over the substrate 101 from each other. In some embodiments, the STI 102 is a trench isolation structure. In some embodiments, the STI 102 includes a dielectric material such as oxide, silicon oxide, etc. In some embodiments, the STI 102 is a dielectric member, an oxide member, etc.

In some embodiments, the STI 102 has a high aspect ratio, for example a width to a height of the STI 102 is about 1:3 to about 1:100. In some embodiments, a height H of the STI 102 is about 300 nm to about 1000 nm. In some embodiments, the height H is about 500 nm to about 800 nm. In some embodiments, the STI 102 is in a funnel or stepped configuration. In some embodiments, the STI 102 includes at least two different widths (W1-1, W1-2 or W2) along its height H. In some embodiments, a sidewall (102c and 102d) of the STI 102 disposed between the STI 102 and the substrate 101 includes at least two different gradients, that a portion (for example, 102c) of the sidewall of the STI 102 is in an angle & relative to another portion (for example, 102d) of the sidewall of the STI 102.

In some embodiments, the STI 102 includes a first portion 102a and a second portion 102b. In some embodiments, the first portion 102a is at least partially disposed within the substrate 101 and tapered from the first surface 101a of the substrate 101 towards the second surface 101b of the substrate 101. In some embodiments, the second portion 102b is disposed inside the substrate 101, coupled with the first portion 102a and extended from the first portion 102a towards the second surface 101b of the substrate 101. In some embodiments, the first portion 102a is referred as an upper portion of the STI 102, and the second portion 102b is referred as a lower or bottom portion of the STI 102. In some embodiments, the first portion 102a is disposed over the second portion 102b.

In some embodiments, the first portion 102a includes a first width W1-1 and a second width W1-2 different from the first width W1-1, such that the first portion 102a is tapered into the substrate 101. In some embodiments, the first width W1-1 is substantially greater than the second width W1-2, or the second width W1-2 is substantially less than the first width W1-1. In some embodiments, the first width W1-1 is about 100 nm to about 500 nm. In some embodiments, the second width W1-2 is about 50 nm to about 250 nm. In some embodiments, a width of the first portion 102a is gradually decreased from the first width W1-1 to the second width W1-2 along a first height H1 of the first portion 102a from the first surface 101a towards the second surface 101b. In some embodiments, the first portion 102a has at least two different widths (W1-1 and W1-2) along the first height H1.

In some embodiments, the first portion 102a includes a first sidewall 102c extended from the first surface 101a towards the second surface 101b or the second portion 102b. In some embodiments, the first sidewall 102c is interfaced with the substrate 101 or is between the first portion 102a and the substrate 101. In some embodiments, the first sidewall 102c is in an angle β relative to the first surface 101a. In some embodiments, the angle β is about 5' to 90°. In some embodiments, the angle 3 is about 15° to 50°.

Figure 1A:
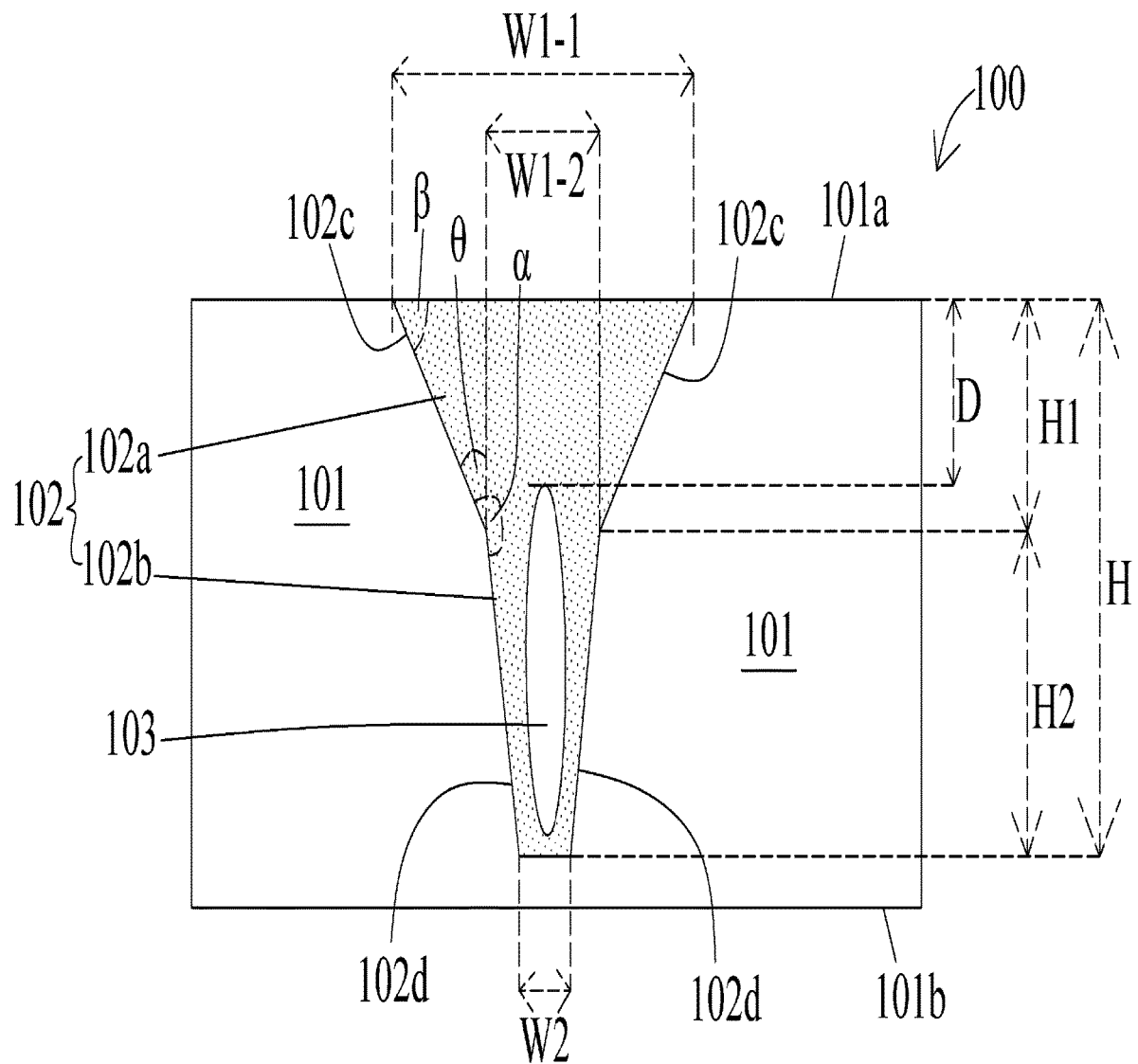
FIG. 1A is a schematic cross sectional view of a semiconductor structure in accordance with some embodiments of the present disclosure.

In some embodiments, the second portion 102b includes a third width W2. In some embodiments, the third width W2 is consistent along a second height H2 of the second portion 102b from the first portion 102a of the STI 102 towards the second surface 101b of the substrate 101. In some embodiments, the second portion 102b has substantially same width W2 along the second height H2. In some embodiments, the third width W2 of the second portion 102b is substantially same as the second width W1-2 of the first portion 102a. In some embodiments, the second portion 102b is tapered from the first portion 102a towards the second surface 101b of the substrate 101. In some embodiments, the second portion 102b includes at least two widths along its second height H2. In some embodiments, the third width W2 is substantially different from or smaller than the second width W1-2 (for example, as shown in FIG. 1A). In some embodiments, the third width W2 is about 50 nm to about 250 nm. In some embodiments, the second height H2 is substantially greater than the third width W2. In some embodiments, the third width W2 to the second height H2 of the second portion 102b is substantially less than 1:2. In some embodiments, the second height H2 is about 200 nm to about 450 nm. In some embodiments, the second portion 102b is in a cylindrical shape.

In some embodiments, the second portion 102b includes a second sidewall 102d extended from the first portion 102a towards the second surface 101b. In some embodiments, the second sidewall 102d is interfaced with the substrate 101 or is disposed between the second portion 102b and the substrate 101. In some embodiments, the second sidewall 102d is substantially orthogonal to the first surface 101a or the second surface 101b of the substrate 101. In some embodiments, the second sidewall 102d is substantially upright. In some embodiments, the second sidewall 102d is tapered from the first portion 102a towards the second surface 101b of the substrate 101.

In some embodiments, the first sidewall 102c is disposed in angle θ relative to the second sidewall 102d. In some embodiments, the angle θ is about 1° to 90°. In some embodiments, the angle θ is about 5° to 85°. In some embodiments, the angle θ is about 50° to 85°. In some embodiments, a gradient of the second sidewall 102d is substantially different from or greater than a gradient of the first sidewall 102c. In some embodiments, an interior angle α between the first sidewall 102c and the second sidewall 102d is substantially greater than 90° but substantially less than 270°. In some embodiments, the interior angle α is about 190° to about 265°.

In some embodiments, the void 103 is enclosed by the STI 102. In some embodiments, the void 103 includes or is filled with air or a material with a dielectric constant (k) of about 1. In some embodiments, the void 103 is in vacuum. In some embodiments, the void 103 is a hollow space inside the STI 102. In some embodiments, the void 103 is at least partially disposed within the second portion 102b of the STI 102. In some embodiments, the second portion 102b is hollowed to include the void 103.

In some embodiments, the void 103 is protruded into and partially surrounded by the first portion 102a of the STI 102. In some embodiments, the void 103 is elongated between the first portion 102a of the STI 102 and the second surface 101b of the substrate 101. In some embodiments, the void 103 is in a tear drop shape. In some embodiments, a volume of the void 103 is substantially greater than a volume of the second portion 102b of the STI 102. In some embodiments, the void 103 is distanced away from a top surface of the STI 102 in a distance D of substantially greater than about 100 nm. In some embodiments, the distance D is about 150 nm to about 500 nm.

Figure 2:
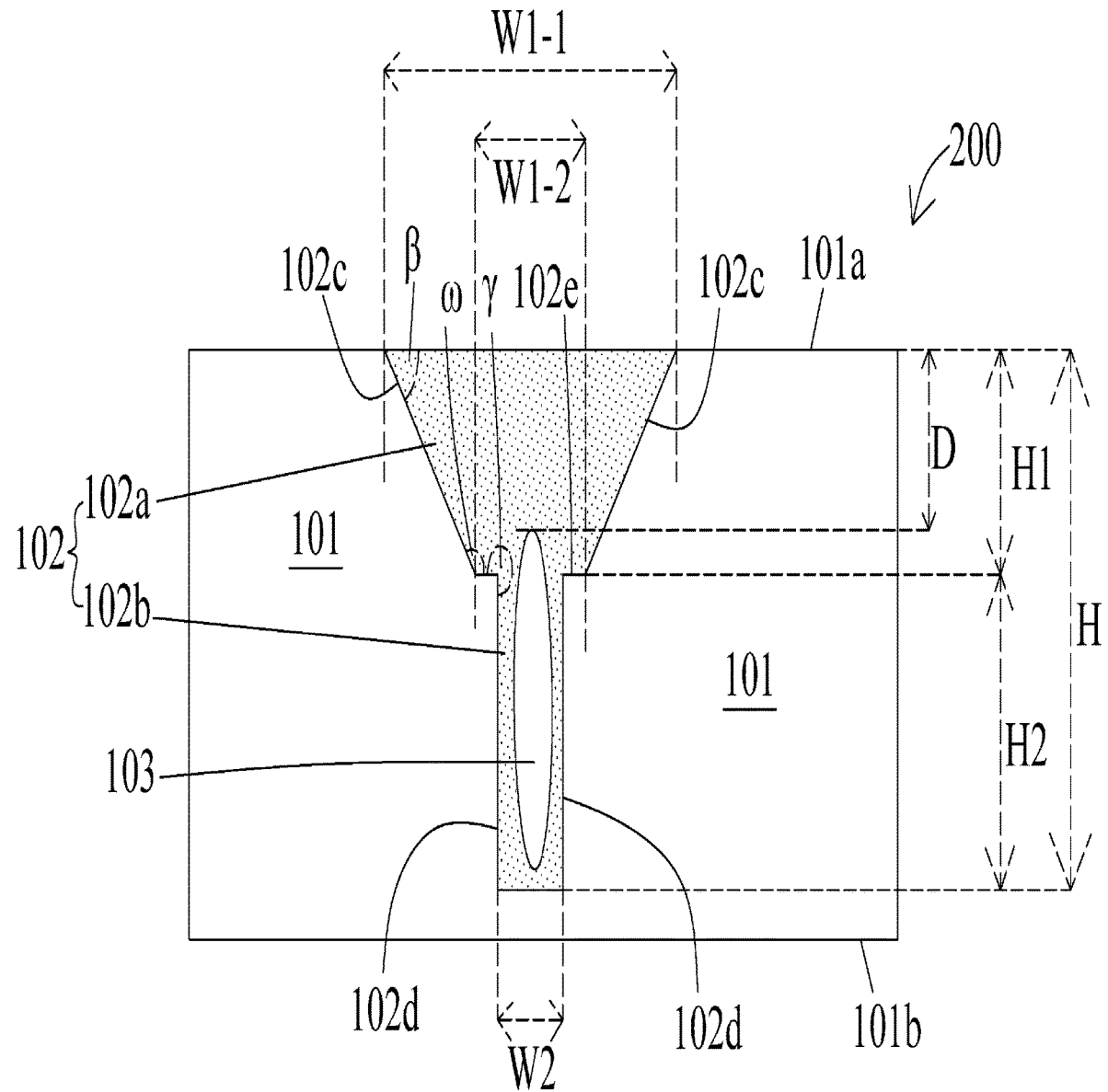
FIG. 2 is a schematic cross sectional view of a semiconductor structure in accordance with some embodiments of the present disclosure.

FIG. 2 is a schematic cross sectional view of a semiconductor structure 200 in accordance with some embodiments of the present disclosure. In some embodiments, the semiconductor structure 200 includes a semiconductive substrate 101, a shallow trench isolation (STI) 102 and a void 103 which have similar configurations as described above or illustrated in FIG. 1. In some embodiments, the STI 102 of the semiconductor structure 200 includes a first portion 102a and a second portion 102b which have similar configurations as described above or illustrated in FIG. 1.

In some embodiments, the first portion 102a includes a first sidewall 102c and a bottom sidewall 102e, and the second portion 102b includes a second sidewall 102d. In some embodiments, the first sidewall 102c of the first portion 102a and the second sidewall 102d of the second portion 102b have similar configurations as described above or illustrated in FIG. 1.

In some embodiments, the bottom sidewall 102e is disposed in an interior angle ω relative to the first sidewall 102c. In some embodiments, the angle γ is about 95° to about 175°. In some embodiments, the bottom sidewall 102e is disposed in an interior angle γ relative to the second sidewall 102d. In some embodiments, the bottom sidewall 102e is substantially orthogonal to the second sidewall 102d.

Figure 2A:
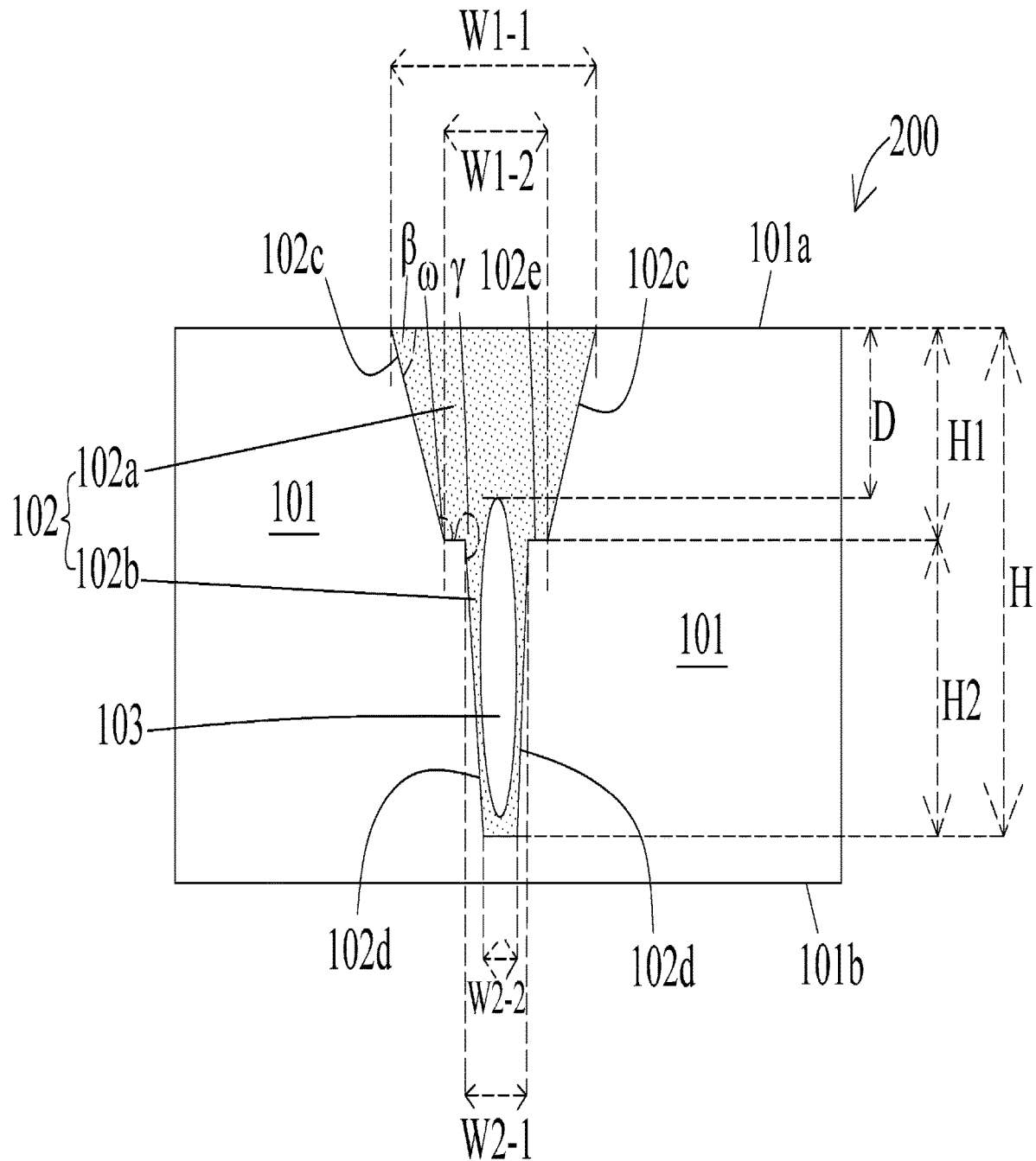
FIG. 2A is a schematic cross sectional view of a semiconductor structure in accordance with some embodiments of the present disclosure.

In some embodiments, the angle γ is about 250° to about 270°. In some embodiments, the second portion 102b includes at least two widths along its second height H2. In some embodiments, the second sidewall 102d is tapered towards the second surface 101b of the substrate 101. In some embodiments, the second portion 102b includes a third width W2-1 and a fourth width W2-2. In some embodiments, the third width W2-1 is substantially different from or greater than the fourth width W2-2 (for example, as shown in FIG. 2A).

Figure 3:
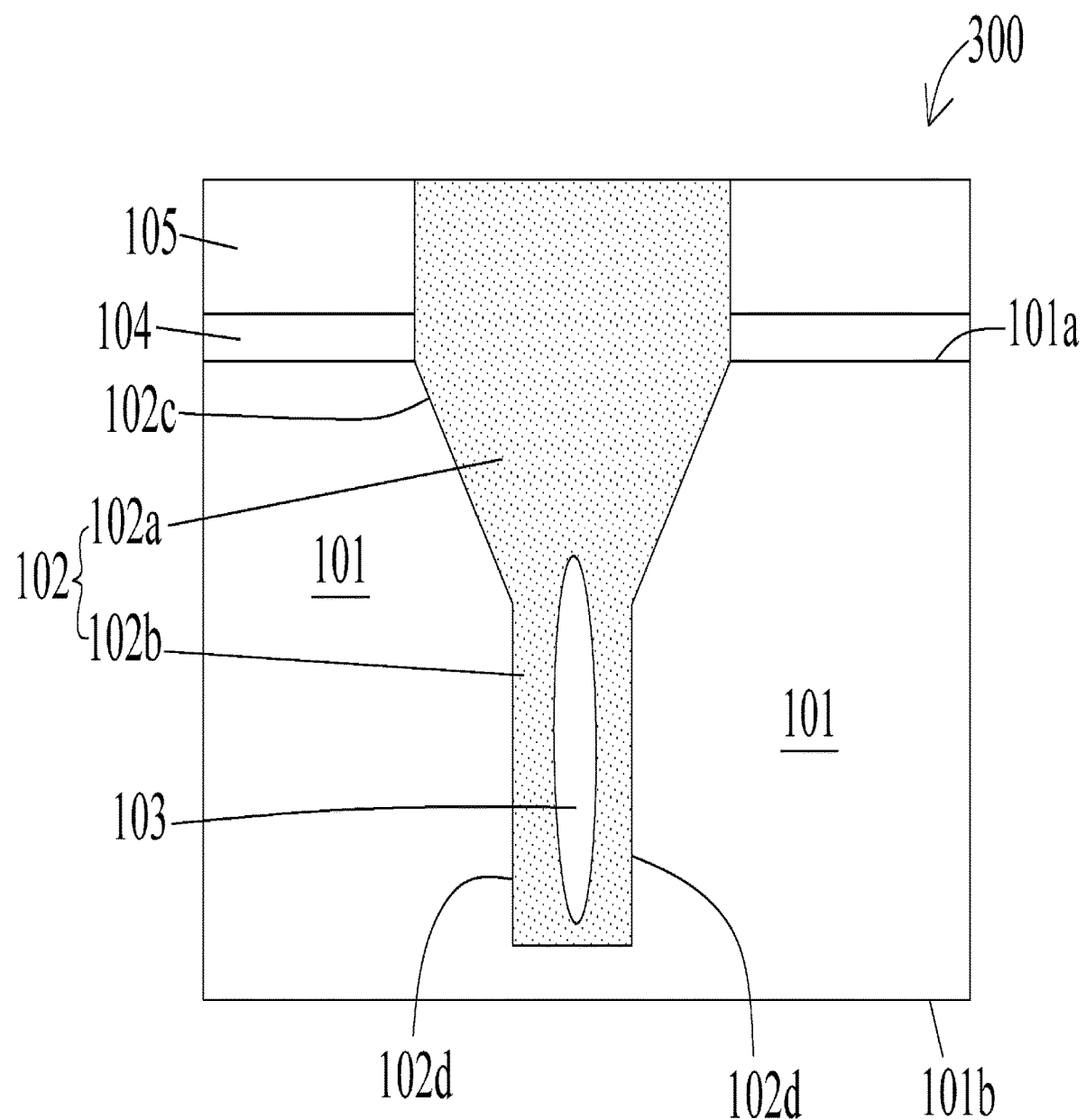
FIG. 3 is a schematic cross sectional view of a semiconductor structure with one or more dielectric layers in accordance with some embodiments of the present disclosure.
Figure 4:
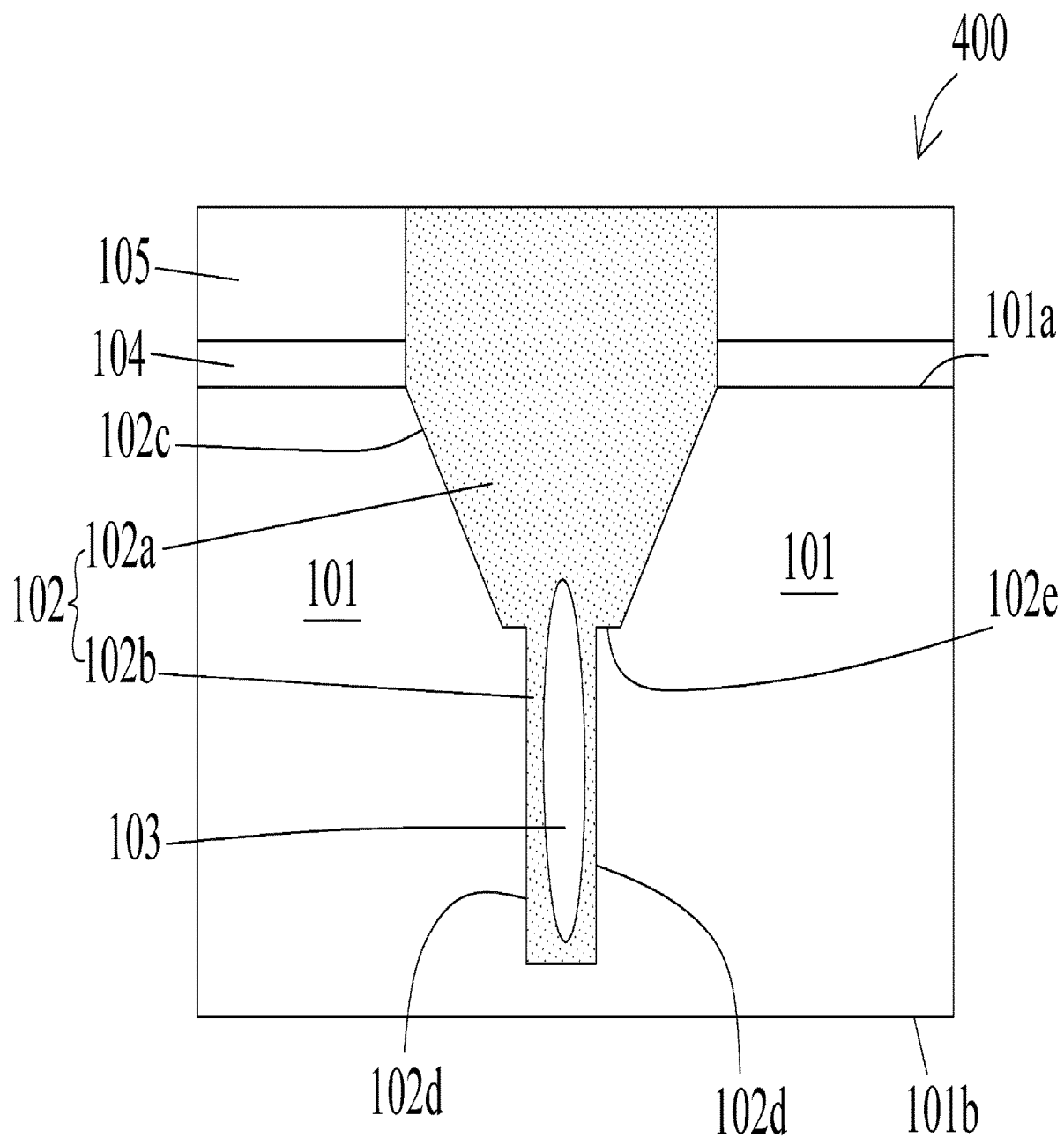
FIG. 4 is a schematic cross sectional view of a semiconductor structure with one or more dielectric layers in accordance with some embodiments of the present disclosure.

FIGS. 3 and 4 are schematic cross sectional views of a semiconductor structure 300 and a semiconductor structure 400 respectively in accordance with some embodiments of the present disclosure. In some embodiments, the semiconductor structure 300 and the semiconductor structure 400 have similar configurations as the semiconductor structure 100 illustrated in FIG. 1 and the semiconductor structure 200 illustrated in FIG. 2 respectively. In some embodiments, the semiconductor structure 300 and the semiconductor structure 400 respectively include a first dielectric layer 104 and a second dielectric layer 105 are disposed over the substrate 101 and surrounding a portion of the STI 102.

In some embodiments, the first dielectric layer 104 includes dielectric material such as oxide, silicon oxide, etc. In some embodiments, the second dielectric layer 105 includes dielectric material such as nitride, silicon nitride, etc. In some embodiments, the first portion 102a of the STI 102 is protruded from the substrate 101.

Figure 5:
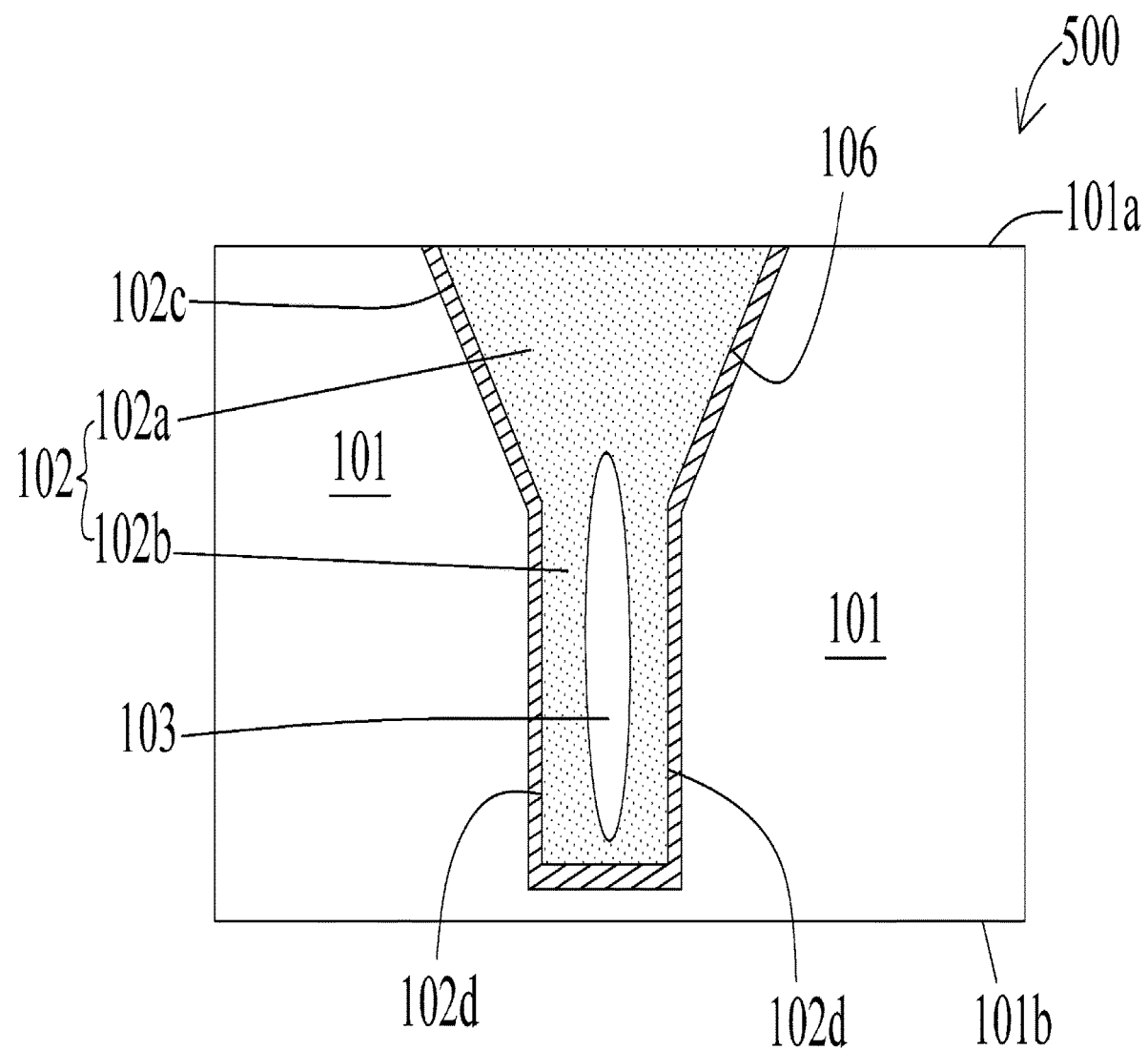
FIG. 5 is a schematic cross sectional view of a semiconductor structure with a dielectric liner in accordance with some embodiments of the present disclosure.
Figure 6:
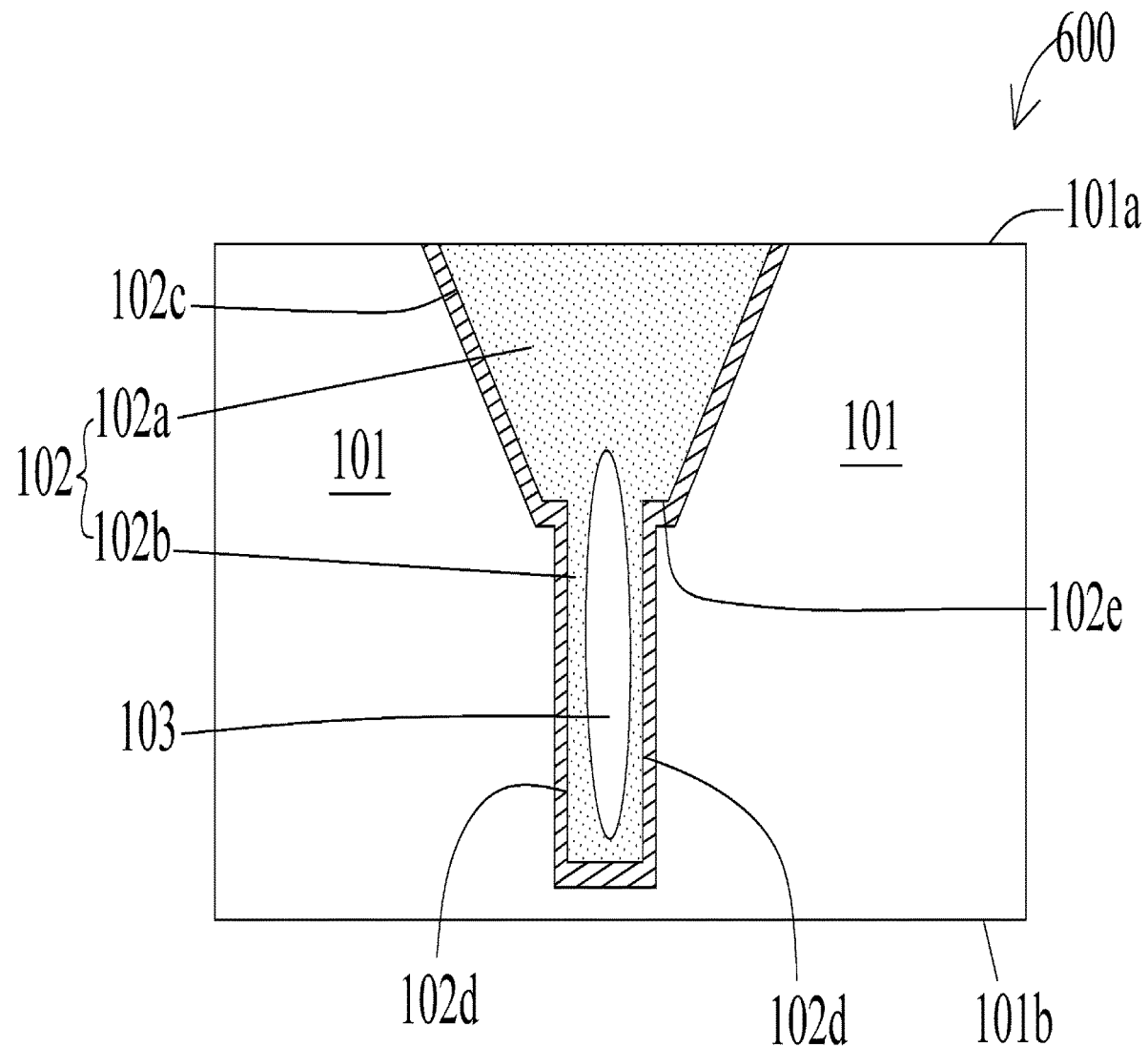
FIG. 6 is a schematic cross sectional view of a semiconductor structure with a dielectric liner in accordance with some embodiments of the present disclosure.

FIGS. 5 and 6 are schematic cross sectional views of a semiconductor structure 500 and a semiconductor structure 600 respectively in accordance with some embodiments of the present disclosure. In some embodiments, the semiconductor structure 500 and the semiconductor structure 600 have similar configurations as the semiconductor structure 100 illustrated in FIG. 1 and the semiconductor structure 200 illustrated in FIG. 2 respectively. In some embodiments, the semiconductor structure 500 and the semiconductor structure 600 respectively include a dielectric liner 106 disposed between the substrate 101 and the STI 102. In some embodiments, the dielectric liner 106 includes dielectric material such as oxide, silicon oxide, etc.

Figure 7:
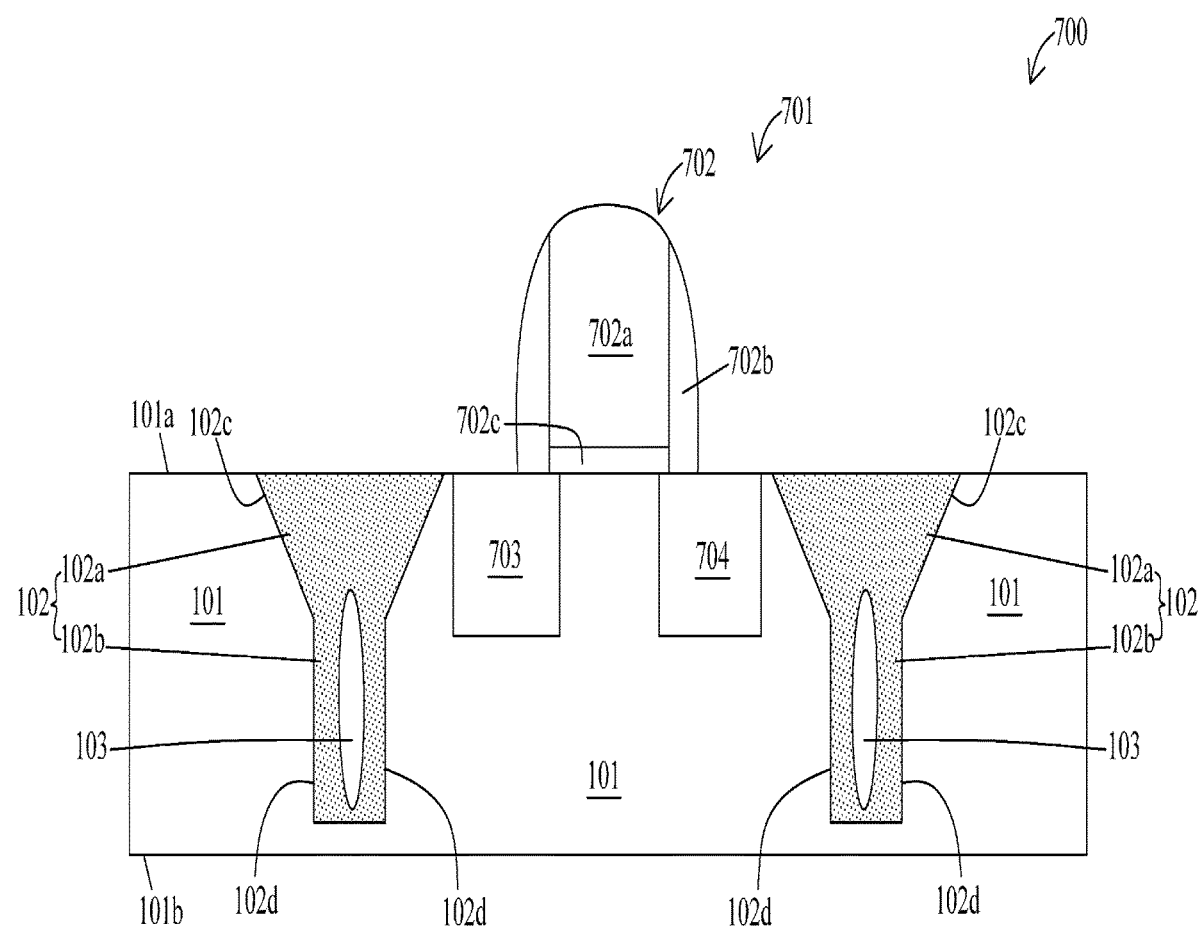
FIG. 7 is a schematic cross sectional view of a semiconductor structure with a transistor device and one or more STIs in accordance with some embodiments of the present disclosure.

FIG. 7 is a schematic cross sectional view of a semiconductor structure 700 in accordance with some embodiments of the present disclosure. In some embodiments, the semiconductor structure 700 is a part of a circuitry. In some embodiments, the semiconductor structure 700 includes a semiconductive substrate 101, one or more STIs 102, one or more voids 103 enclosed by their respective STIs 102 and a transistor device 701 disposed over or within the substrate 101. In some embodiments, the substrate 101, the STI 102 and the void 103 have similar configurations as described above or illustrated in any one of FIGS. 1-6.

In some embodiments, the substrate 101 is doped with a p-type dopant such as boron or an n-type dopant such as phosphorous to include a source region 703 and a drain region 704. In some embodiments, the source region 703 and the drain region 704 are electrically isolated by the STIs 102. In some embodiments, the transistor device 701 includes a gate structure 702. In some embodiments, the gate structure 702 includes a gate electrode 702a, a spacer 702b and a gate dielectric layer 702c.

In some embodiments, the gate electrode 702a includes a conductive material such as polycrystalline silicon (polysilicon), aluminum, copper, titanium, tungsten, etc. In some embodiments, the spacer 702b includes a dielectric material, such as silicon oxide, silicon oxynitride, silicon nitride, a high-k dielectric material (a material with a dielectric constant greater than a dielectric constant of silicon dioxide), etc. In some embodiments, the gate dielectric layer 702c includes a dielectric material, such as silicon oxide, silicon oxynitride, silicon nitride, a high-k dielectric material, etc.

Figure 8:
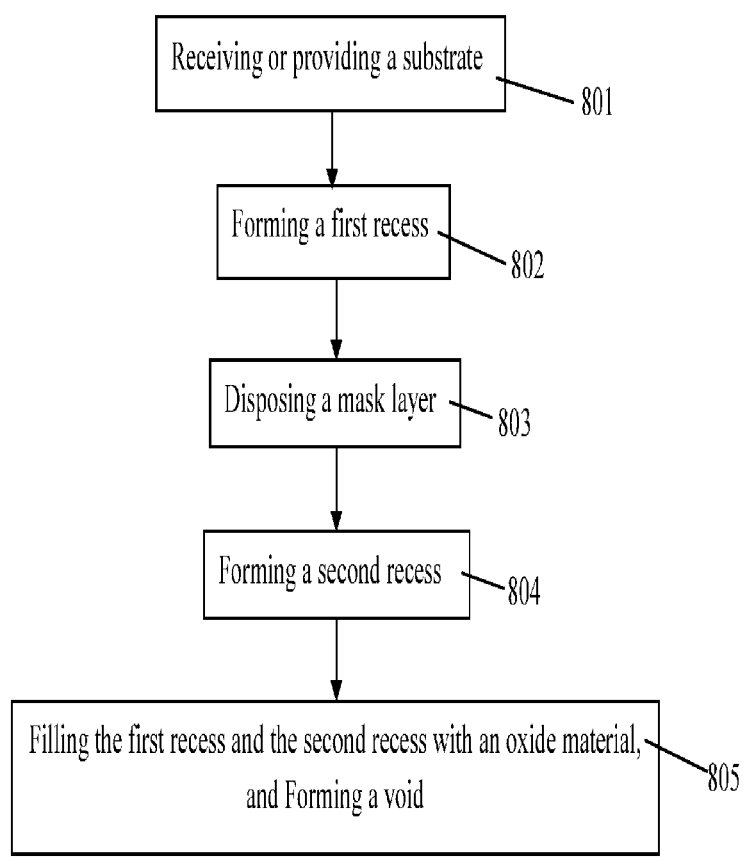
FIG. 8 is a flow diagram of a method of manufacturing a semiconductor structure in accordance with some embodiments of the present disclosure.

In the present disclosure, a method of manufacturing a semiconductor structure is also disclosed. In some embodiments, a semiconductor structure is formed by a method. The method includes a number of operations and the description and illustration are not deemed as a limitation as the sequence of the operations. FIG. 8 is an embodiment of a method 800 of manufacturing a semiconductor structure. The method 800 includes a number of operations (801, 802, 803, 804 and 805).

In operation 801, a semiconductive substrate 101 is received as shown in FIG. 8A. In some embodiments, the substrate 101 is a silicon substrate or silicon wafer. In some embodiments, the substrate 101 has similar configuration as described above or illustrated in any one of FIGS. 1-7.

In operation 802, a first recess 901 is formed as shown in FIGS. 8B-8D. In some embodiments, a first dielectric layer 104 and a second dielectric layer 105 are disposed over the substrate 101 as shown in FIG. 8B. In some embodiments, the second dielectric layer 105 is disposed over the first dielectric layer 104. In some embodiments, the first dielectric layer 104 and the second dielectric layer 105 disposed over the substrate 101 by any suitable deposition operations such as chemical vapor deposition (CVD), etc. In some embodiments, the first dielectric layer 104 includes oxide, and the second dielectric layer 105 includes nitride.

After the deposition of the first dielectric layer 104 and the second dielectric layer 105, the first dielectric layer 104 and the second dielectric layer 105 are patterned by removing a predetermined portion of the first dielectric layer 104 and the second dielectric layer 105. In some embodiments, the first dielectric layer 104 and the second dielectric layer 105 are patterned by any suitable operations such as photolithography and etching, etc. In some embodiments, a patterned photoresist is disposed over the second dielectric layer 105, such that the predetermined portion of the first dielectric layer 104 and the second dielectric layer 105 is exposed from the patterned photoresist, and then the predetermined portion of the first dielectric layer 104 and the second dielectric layer 105 is removed by any suitable operations such as dry etching, etc. In some embodiments, the first dielectric layer 104 and the second dielectric layer 105 are patterned as shown in FIG. 8C.

After the patterning of the first dielectric layer 104 and the second dielectric layer 105, a first portion 101a of the substrate 101 corresponding to the predetermined portion of the first dielectric layer 104 and the second dielectric layer 105 is exposed from the first dielectric layer 104 and the second dielectric layer 105 as shown in FIG. 8C. In some embodiments, the first recess 901 is formed by removing the first portion 101a of the substrate 101 as shown in FIG. 8D. In some embodiments, the first portion 101a exposed from the patterned first dielectric layer 104 and second dielectric layer 105 is removing by any suitable operations such as dry etching, etc.

In some embodiments, the first recess 901 includes a sidewall 901a and a bottom surface 901b. In some embodiments, the sidewall 901a is a tapered or sloped sidewall tapering from the first surface 101a into the substrate 101. In some embodiments, the bottom surface 901b is substantially parallel to the first surface 101a or the second surface 101b of the substrate 101. In some embodiments, the first recess 901 includes a first width W1-1 and a second width W1-2 substantially less than the first width W1-1.

Figure 8E:
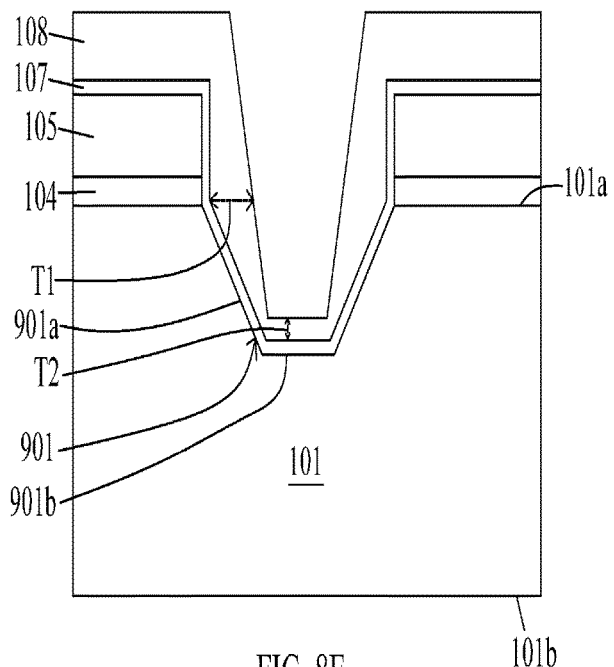
FIGS. 8A-8O are schematic views of manufacturing a semiconductor structure by a method of FIG. 5 in accordance with some embodiments of the present disclosure.
Figure 8F:
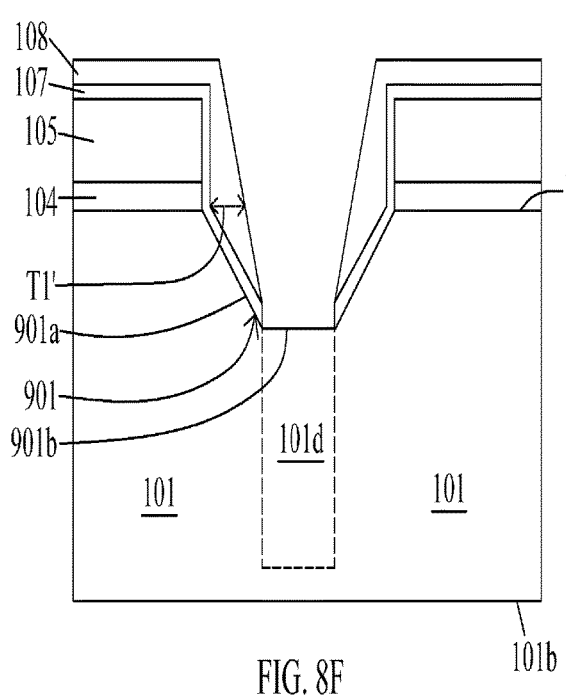
Figure 8G:
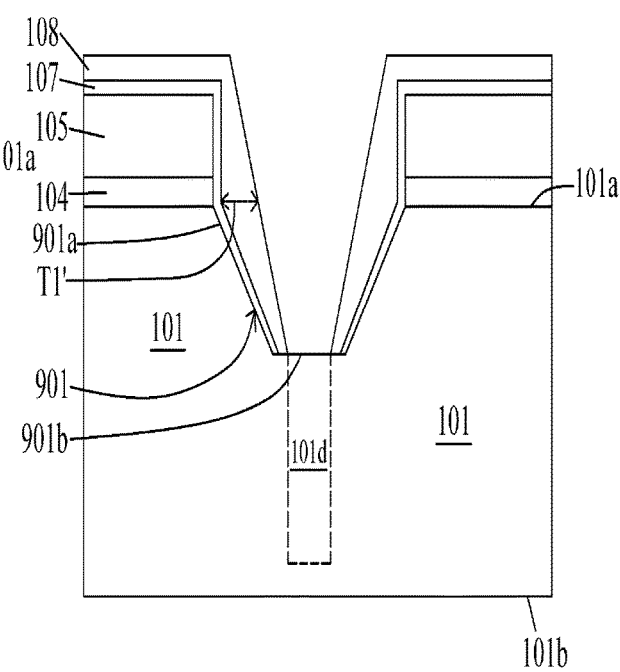

In operation 803, a mask layer 108 is disposed over the substrate 101 and along the sidewall 901a and the bottom surface 901b of the first recess 901 as shown in FIGS. 8E-8G. In some embodiments, a third dielectric layer 107 is disposed over the second dielectric layer 105 and along the sidewall 901a and the bottom surface 901b of the first recess 901 as shown in FIG. 8E. In some embodiments, the third dielectric layer 107 is disposed between the mask layer 108 and the second dielectric layer 105 and the substrate 101. In some embodiments, the third dielectric layer 107 is conformal to the sidewall 901a, the bottom surface 901b and the second dielectric layer 105. In some embodiments, the third dielectric layer 107 includes oxide and is disposed by any suitable operations such as CVD, etc.

In some embodiments, the mask layer 108 is disposed over the substrate 101 and within the first recess 901. In some embodiments, the mask layer 108 is disposed over the third dielectric layer 107. In some embodiments, the mask layer 108 includes nitride and is disposed by any suitable operations such as CVD, etc. In some embodiments, a thickness T1 of the mask layer 108 disposed over or adjacent to the sidewall 901 of the first recess 901 is substantially greater than a thickness of the mask layer 108 disposed over the substrate 101 or a thickness T2 of the mask layer 108 disposed over the bottom surface 901b of the first recess 901. In some embodiments, the mask layer 108 is disposed in a deposition rate faster at or over the sidewall 901a than at or over the bottom surface 901b, such that thickness T1 is greater than the thickness T2 as shown in FIG. 8E.

After the deposition of the mask layer 108, a portion of the mask layer 108 disposed over or at the bottom surface 901b of the first recess 901 is removed as shown in FIG. 8F or 8G. In some embodiments, the portion of the mask layer 108 disposed over the bottom surface 901b with the thickness T2 is removed to expose a second portion 101d of the substrate 101.

In some embodiments, the mask layer 108 is partially removed by any suitable operations such as etching, that a whole thickness of the mask layer 108 is reduced (for example, comparison of FIG. 8E and FIG. 8F or 8G). Since the thickness T1 of the mask layer 108 is greater than the thickness T2 of the mask layer 108, the portion of the mask layer 108 disposed over the bottom surface 901b is completely removed while the mask layer 108 disposed over the sidewall 901a is still present, that the thickness T1 of the mask layer 108 disposed over the sidewall 901a is reduced to a reduced thickness T1' after the partial removal operations of the mask layer 108. As such, the sidewall 901a of the first recess 901 is still covered by the mask layer 108, while the second portion 101d of the substrate 101 is exposed from the mask layer 108. In some embodiments, the third dielectric layer 107 disposed over the bottom surface 901b of the first recess 901 is also removed as shown in FIG. 8F, such that the second portion 101d of the substrate 101 is exposed from the third dielectric layer 107 and the mask layer 108.

In operation 804, a second recess 902 is formed as shown in FIGS. 8H and 8J or 8I and 8K. In some embodiments, the second portion 101d of the substrate 101 exposed from the mask layer 108 is removed to form the second recess 902 as shown in FIG. 8H or 8I. In some embodiments, the second portion 101d is removed by any suitable operations such as dry etching, etc. In some embodiments, the first recess 901 is disposed over and coupled with the second recess 902. In some embodiments, the second recess 902 is extended from the first recess 901 into the substrate 101 towards the second surface 101b of the substrate 101. In some embodiments, the mask layer 108 and the third dielectric layer 107 are removed by any suitable operations such as stripping, etching, etc. as shown in FIG. 8J or 8K after the formation of the second recess 902.

In some embodiments, the second recess 902 is extended in a consistent width W2 along a height H2 of the second recess from the first recess 901. In some embodiments, the width W2 of the second recess 902 is substantially same as the width W1-2 of the first recess 901. In some embodiments, the second recess 902 includes a sidewall 902a. In some embodiments, the sidewall 902a is substantially orthogonal to the first surface 101a or the second surface 101b of the substrate 101. In some embodiments, the sidewall 901a of the first recess 901 is tapered towards the second recess 902. In some embodiments, the sidewall 901a of the first recess 901 is disposed in an angle θ relative to the sidewall 902a of the second recess 902. In some embodiments, a gradient of the sidewall 901a of the first recess 901 is substantially different from a gradient of the sidewall 902a of the second recess 902.

In some embodiments, the first recess 901 includes a bottom sidewall 901c as shown in FIG. 8K after the removal of the mask layer 108 and the third dielectric layer 107 as shown in FIG. 8I. In some embodiments, the bottom sidewall 901c is disposed between and is coupled with the sidewall 901a of the first recess 901 and the sidewall 902a of the second recess 902. In some embodiments, the bottom sidewall 901c is substantially orthogonal to the sidewall 902a. In some embodiments, the bottom sidewall 901c of the first recess 901 is disposed in an interior angle γ relative to the sidewall 902a of the second recess 902.

In operation 805, the first recess 901 and the second recess 902 are filled by an oxide material and a void 103 is formed as shown in any one of FIGS. 8L-8O 8K. In some embodiments, the oxide material fills the first recess 901 and the second recess 902 as shown in FIG. 8J or 8K to form a semiconductor structure 300 as shown in FIG. 8L or a semiconductor structure 400 as shown in FIG. 8M respectively. In some embodiments, a STI 102 is formed after the first recess 901 and the second recess 902 are filled with the oxide material. In some embodiments, the STI 102 includes a first portion 102a within the first recess 901 and a second portion 102b within the second recess 902.

In some embodiments, the void 103 is formed within the first recess 901 or the second recess 902 during the filling of the oxide material. In some embodiments, the void 103 is at least partially disposed within the second recess 902. In some embodiments, the semiconductor structure 300 as shown in FIG. 8L has similar configuration as the semiconductor structure 300 as shown in FIG. 3, and the semiconductor structure 400 as shown in FIG. 8M has similar configuration as the semiconductor structure 400 as shown in FIG. 4.

In some embodiments, the oxide material fills the first recess 901 and the second recess 902 as shown in FIG. 8J or 8K to become the semiconductor structure 300 as shown in FIG. 8L or the semiconductor structure 400 as shown in FIG. 8M respectively, and then the first dielectric layer 104 and the second dielectric layer 105 and a top portion of the oxide material out of the first recess 901 are removed by any suitable operations such as stripping, etc. to form a semiconductor structure 100 as shown in FIG. 8N or a semiconductor structure 200 as shown in FIG. 8O respectively.

In some embodiments, the void 103 is formed within the first recess 901 or the second recess 902 during the filling of the oxide material. In some embodiments, the void 103 is at least partially disposed within the second recess 902. In some embodiments, the semiconductor structure 100 as shown in FIG. 8N has similar configuration as the semiconductor structure 100 as shown in FIG. 1, and the semiconductor structure 200 as shown in FIG. 8O has similar configuration as the semiconductor structure 200 as shown in FIG. 2.

In the present disclosure, an improved semiconductor structure is disclosed. The semiconductor structure includes a substrate, a shallow trench isolation (STI) extending into the substrate and a void enclosed by the STI. The STI includes a first portion tapered into the substrate and a second portion extended from the first portion into the substrate. Such structural configuration of the STI allows the void to be formed at least partially within the second portion of the STI or at a position away from the surface of the semiconductive substrate. Therefore, a position of the void can be controlled, such that the void can be formed at least partially within the second portion of the STI as desired.

In some embodiments, a semiconductor structure includes a semiconductive substrate including a first surface and a second surface opposite to the first surface, a shallow trench isolation (STI) including a first portion at least partially disposed within the semiconductive substrate and tapered from the first surface towards the second surface, and a second portion disposed inside the semiconductive substrate, coupled with the first portion and extended from the first portion towards the second surface, and a void enclosed by the STI, wherein the void is at least partially disposed within the second portion of the STI.

In some embodiments, the void is protruded into and partially surrounded by the first portion of the STI. In some embodiments, the first portion of the STI includes a first width and a second width substantially less than the first width, a width of the second portion of the STI is consistent along a height of the second portion from the first portion of the STI towards the second surface of the semiconductive substrate. In some embodiments, the width of the second portion of the STI is substantially same as the second width of the first portion of the STI.

In some embodiments, a sidewall of the STI disposed between the STI and the semiconductive substrate includes at least two different gradients. In some embodiments, the semiconductor structure further includes a first sidewall of the first portion disposed between the semiconductive substrate and the first portion of the STI, and a second sidewall of the second portion disposed between the semiconductive substrate and the second portion of the STI, wherein the first sidewall is disposed in an angle relative to the second sidewall, or a gradient of the second sidewall is substantially different from or greater than a gradient of the first sidewall. In some embodiments, the angle is about 1° to about 85°.

In some embodiments, a ratio of a width of the second portion to a height of the second portion is substantially less than 1:2. In some embodiments, a sidewall of the second portion disposed between the semiconductive substrate and the second portion of the STI is substantially orthogonal to the first surface of the semiconductive substrate. In some embodiments, the STI is in a funnel or a stepped configuration. In some embodiments, the STI includes oxide, or the void includes air or a material with a dielectric constant of about 1 or is in vacuum. In some embodiments, the semiconductor structure further includes a dielectric liner disposed between the semiconductive substrate and the STI.

In some embodiments, a semiconductor structure includes a silicon substrate including a first surface and a second surface opposite to the first surface, an oxide member at least partially disposed within the substrate, and including a first portion extended from the first surface towards the second surface and a second portion disposed inside the substrate, coupled with the first portion and extended from the first portion towards the second surface, wherein the second portion includes a hollow space.

In some embodiments, the hollow space is filled with air or is in vacuum. In some embodiments, the hollow space is elongated between the first portion and the second surface. In some embodiments, a volume of the hollow space is substantially greater than a volume of the second portion of the oxide member.

In some embodiments, a method of manufacturing a semiconductor structure includes receiving a substrate, removing a first portion of the substrate to form a first recess, disposing a mask layer over the substrate and along a sidewall of the first recess and a bottom surface of the first recess, removing a portion of the mask layer disposed over the bottom surface of the first recess, removing a second portion of the substrate exposed from the mask layer to form a second recess, removing the mask layer, filling the first recess and the second recess by an oxide material, and forming a void at least partially disposed within the second recess.

In some embodiments, a thickness of the mask layer disposed over the sidewall of the first recess is substantially greater than a thickness of the mask layer disposed over the substrate or a thickness of the mask layer disposed over the bottom surface of the first recess. In some embodiments, the first recess includes a first width and a second width substantially less than the first width, a width of the second recess is consistent along a height of the second portion from the first recess. In some embodiments, the sidewall of the first recess is tapered towards the second recess, or the sidewall of the first recess is disposed in an angle relative to a sidewall of the second recess, or a gradient of the sidewall of the first recess is substantially different from a gradient of a sidewall of the second recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of manufacturing a semiconductor structure, comprising:
   removing a first portion of a substrate to form a first recess, wherein the first recess includes a first width and a second width substantially less than the first width;
   disposing a first layer over the substrate and along a sidewall of the first recess and a bottom surface of the first recess;
   etching the first layer such that a first portion of the first layer disposed over the bottom surface of the first recess is removed and a second portion of the first layer disposed over the sidewall of the first recess is decreased in thickness;
   removing a second portion of the substrate exposed from the first layer to form a second recess, wherein a width of the second recess is consistent along a height of the second portion from the first recess;
   after removing the second portion of the substrate, removing the first layer; and
   depositing a dielectric material in the first recess and the second recess, wherein the depositing includes forming a void at least partially disposed within the first recess and the second recess.

2. The method of claim 1, wherein before etching the first layer, a thickness of the first layer disposed over the sidewall of the first recess is substantially greater than a thickness of the first layer disposed over the bottom surface of the first recess.

3. The method of claim 1, wherein the removing the first portion of the substrate to form the first recess forms the sidewall of the first recess tapered continuously from a top of the first recess to a bottom of the first recess towards the second recess.

4. The method of claim 1, wherein after the etching the first layer and before the removing the second portion of the substrate, a second portion of the first layer is disposed on a region of the bottom surface of the first recess.

5. The method of claim 1, further comprising: prior to disposing the first layer, forming at least one dielectric layer under the first layer and along the sidewall of the first recess and the bottom surface of the first recess.

6. The method of claim 5, wherein the etching the first layer exposes the dielectric layer.

7. A method of manufacturing a semiconductor structure, comprising:
   removing a first portion of a substrate to form a first recess, the first recess having a first width at a top surface and a second width defined by a bottom surface of the first recess, the first width greater than the second width;
   depositing a plurality of layers along a sidewall of the first recess and the bottom surface of the first recess;
   etching the plurality of layers to expose the bottom surface of the first recess;
   etching the exposed bottom surface of the first recess to form a second recess connected to the first recess and extending into the substrate while the plurality of layers are disposed along the sidewalls of the first recess; and
   depositing a dielectric material in the first recess and the second recess.

8. The method of manufacturing the semiconductor structure of claim 7, wherein the depositing the plurality of layers includes forming at least one layer of the plurality of layers having a greater thickness at the sidewall of the first recess than along the bottom surface of the first recess.

9. The method of manufacturing the semiconductor structure of claim 8, wherein the at least one layer is a nitride composition.

10. The method of manufacturing the semiconductor structure of claim 8, wherein the etching the at least one layer decreases a thickness of the at least one layer on the sidewall of the first recess from a first thickness to a second thickness greater than zero.

11. The method of manufacturing the semiconductor structure of claim 7, wherein the depositing the dielectric material forms a void in the second recess.

12. The method of manufacturing the semiconductor structure of claim 11, wherein the void extends to the first recess.

13. The method of manufacturing the semiconductor structure of claim 7, wherein etching the plurality of layers to expose the bottom surface of the first recess provides for removing the plurality of layers from a first portion of the bottom surface while another portion of the bottom surface of the first recess is covered by the plurality of layers.

14. The method of manufacturing the semiconductor structure of claim 7, wherein the plurality of layers includes an oxide layer and a nitride layer overlying the oxide layer.

15. A method of manufacturing a semiconductor structure, comprising:

removing a first portion of a substrate to form a first recess, the first recess having a first width at a top surface and a second width defined by a bottom surface of the first recess, the first width greater than the second width;

depositing a dielectric layer and a mask layer over the dielectric layer along a sidewall of the first recess and the bottom surface of the first recess;

etching the dielectric layer and the mask layer to expose a first region of the bottom surface of the first recess, wherein a second region of the bottom surface and a third region of the bottom surface each of the second region and the third region having a first portion covered with the dielectric layer and a second portion covered with the mask layer after the etching, and wherein the first region interposes the second region and the third region;

etching the first region of the bottom surface of the first recess to form a second recess connected to the first recess and extending into the substrate while the dielectric layer and the mask layer are disposed on the second region and the third region;

removing the dielectric layer and the mask layer along the sidewalls and the second region and third region of the bottom surface of the first recess; and filling the first recess and the second recess with a dielectric material and a void surrounded by the dielectric material, wherein the dielectric material interfaces with the second region and the third region of the bottom surface of the first recess and the void extends from the second recess to above the bottom surface of the first recess.

16. The method of manufacturing a semiconductor structure of claim 15, wherein the void is in vacuum.

17. The method of manufacturing a semiconductor structure of claim 15, wherein the removing the first portion of the substrate to form the first recess includes forming the sidewall of the first recess having a taper.

18. The method of manufacturing a semiconductor structure of claim 15, wherein the forming the second recess includes forming sidewalls of the second recess that extend perpendicular to the second region or the third region of the bottom surface of the first recess.

19. The method of manufacturing a semiconductor structure of claim 15, wherein the dielectric layer is an oxide and the mask layer is a nitride.

20. The method of manufacturing a semiconductor structure of claim 15, wherein the dielectric layer and the mask layer remain over the top surface of the substrate adjacent the first recess during the etching the first region of the bottom surface of the first recess to form the second recess.

* * * * *